United States Patent
Soma et al.

(10) Patent No.: US 10,892,188 B2
(45) Date of Patent: Jan. 12, 2021

(54) SELF-ALIGNED TRENCH MOSFET CONTACTS HAVING WIDTHS LESS THAN MINIMUM LITHOGRAPHY LIMITS

(71) Applicant: SEMICONDUCTOR COMPONENTS INDUSTRIES, LLC, Phoenix, AZ (US)

(72) Inventors: Mitsuru Soma, Higashimatsuyama (JP); Masahiro Shimbo, Djiya (JP); Masaki Kuramae, Aizuwakamatsu (JP); Kouhei Uchida, Aizu-wakamatsu (JP)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 16/449,890

(22) Filed: Jun. 24, 2019

(65) Prior Publication Data
US 2020/0395245 A1    Dec. 17, 2020

Related U.S. Application Data

(60) Provisional application No. 62/860,959, filed on Jun. 13, 2019.

(51) Int. Cl.
| | |
|---|---|
| *H01L 29/40* | (2006.01) |
| *H01L 29/41* | (2006.01) |
| *H01L 29/43* | (2006.01) |
| *H01L 29/66* | (2006.01) |
| *H01L 29/78* | (2006.01) |

(Continued)

(52) U.S. Cl.
CPC .. *H01L 21/76897* (2013.01); *H01L 21/26586* (2013.01); *H01L 21/3086* (2013.01); *H01L 29/401* (2013.01); *H01L 29/41741* (2013.01); *H01L 29/4236* (2013.01);
(Continued)

(58) Field of Classification Search
CPC ............. H01L 29/401; H01L 29/41741; H01L 29/4326; H01L 29/66666; H01L 29/7827; H01L 29/7813; H01L 29/105; H01L 29/4236
See application file for complete search history.

(56) References Cited

U.S. PATENT DOCUMENTS

| | | | | |
|---|---|---|---|---|
| 5,385,853 A | * | 1/1995 | Mohammad | ...... H01L 29/66666 257/330 |
| 6,051,468 A | * | 4/2000 | Hshieh | ................ H01L 29/7813 438/270 |

(Continued)

*Primary Examiner* — Ida M Soward
(74) *Attorney, Agent, or Firm* — Chamberlain Hrdlicka

(57) ABSTRACT

Semiconductor devices made by forming hard mask pillars on a surface of a substrate, forming sacrificial spacers on a first side of each hard mask pillar and a second side of each hard mask pillar. The open gaps may be formed between adjacent sacrificial spacers. The semiconductor devices may also be formed by etching the hard mask pillars to form pillar gaps, etching gate trenches into the substrate through the open gaps and the pillar gaps, forming a gate electrode within the gate trenches, implanting channels and sources in the substrate below the sacrificial spacers, forming an insulator layer around the sacrificial spacers, etching the sacrificial spacers to form contact trenches within the substrate, and filling the contact trenches with a conductive material to form contacts.

9 Claims, 8 Drawing Sheets

(51) Int. Cl.
    *H01L 29/10*     (2006.01)
    *H01L 21/768*     (2006.01)
    *H01L 29/423*     (2006.01)
    *H01L 21/265*     (2006.01)
    *H01L 29/417*     (2006.01)
    *H01L 21/308*     (2006.01)

(52) U.S. Cl.
    CPC .... *H01L 29/66666* (2013.01); *H01L 29/7827* (2013.01); *H01L 29/105* (2013.01); *H01L 29/7813* (2013.01)

(56) References Cited

U.S. PATENT DOCUMENTS

| | | | | |
|---|---|---|---|---|
| 6,555,872 B1 * | 4/2003 | Dennen | ............... | H01L 29/4236 257/327 |
| 6,852,597 B2 * | 2/2005 | Park | .................... | H01L 29/7813 438/268 |
| 7,732,341 B2 | 6/2010 | Koh et al. | | |
| 8,003,543 B2 | 8/2011 | Koh et al. | | |
| 8,278,221 B2 | 10/2012 | Koh et al. | | |
| 8,471,331 B2 * | 6/2013 | Iyer | ..................... | H01L 29/781 257/330 |
| 8,772,788 B2 * | 7/2014 | Ikegami | .............. | H01L 29/0623 257/77 |
| 8,890,242 B2 * | 11/2014 | Chang | ................. | H01L 29/4238 257/334 |
| 9,224,855 B2 * | 12/2015 | Zeng | .................. | H01L 29/66719 257/334 |
| 2002/0038886 A1 * | 4/2002 | Mo | ...................... | H01L 29/7813 257/330 |
| 2004/0185622 A1 * | 9/2004 | Williams | ............ | H01L 29/7808 438/270 |
| 2006/0154477 A1 * | 7/2006 | Geng | ................ | H01L 21/76802 438/637 |
| 2009/0108344 A1 * | 4/2009 | Kumekawa | ......... | H01L 29/4238 257/330 |
| 2010/0090270 A1 * | 4/2010 | Hsieh | .................. | H01L 29/7811 257/328 |
| 2010/0127324 A1 | 5/2010 | Hsieh | | |
| 2011/0269294 A1 | 11/2011 | Koh et al. | | |
| 2011/0291186 A1 * | 12/2011 | Yilmaz | ............. | H01L 29/66719 257/334 |
| 2013/0214349 A1 * | 8/2013 | Gu | ..................... | H01L 29/66727 257/330 |
| 2013/0234237 A1 * | 9/2013 | Hsieh | ................ | H01L 29/66734 257/328 |
| 2014/0159149 A1 * | 6/2014 | Hsieh | ................ | H01L 29/7813 257/331 |

\* cited by examiner

SELF-ALIGNED TRENCH MOSFET CONTACTS HAVING WIDTHS LESS THAN MINIMUM LITHOGRAPHY LIMITS

CROSS-REFERENCE TO RELATED APPLICATIONS

This application claims the benefit of U.S. Provisional Patent Application No. 62/860,959, filed on Jun. 13, 2019, the entire contents of which is incorporated herein by reference.

BACKGROUND

For trench MOSFET devices, reducing the resistance of the channel region (i.e., $R_{ON}$) allows more current to travel through the switch. Lowering the device pitch of the semiconductor circuit is one way to achieve a lower $R_{ON}$. One way to decrease the device pitch is to use lithographic processes that locate the devices closer to one another on a substrate. For current trench MOSFET manufacturing processes, lithographic capabilities are limited to a minimum device pitch of about 200 nm or 300 nm. For example, a KrF scanner has a minimum of about 300 nm of device pitch, and an ArF scanner has a minimum of about 200 nm of device pitch. Reducing the device pitch beyond the minimum lithographic capabilities requires additional techniques.

BRIEF DESCRIPTION OF THE DRAWINGS

Embodiments are described with reference to the following figures. The same numbers are used throughout the figures to reference like features and components. The features depicted in the figures are not necessarily shown to scale. Certain features of the embodiments may be shown exaggerated in scale or in somewhat schematic form, and some details of elements may not be shown in the interest of clarity and conciseness.

DETAILED DESCRIPTION OF THE DRAWINGS

The embodiments disclosed here include using spacers during fabrication of a semiconductor device to decrease the device pitch without changing the lithography processes. Specifically, embodiments may include forming sacrificial spacers on either side of a hard mask component (e.g., hard mask pillar), and then removing the sacrificial spacers later in the fabrication process to form contact trenches and contacts. These resulting contacts are aligned with the gate trenches, the device pitch is about half of the lithographic limit, the device has a higher body/source ratio of a width with a smaller Si mesa due to the self-aligning double patterning scheme described herein. As used herein, "self-align" means that the contacts and electrodes are formed to align with each other without a lithographic process for each contact or electrode.

Figure 1:
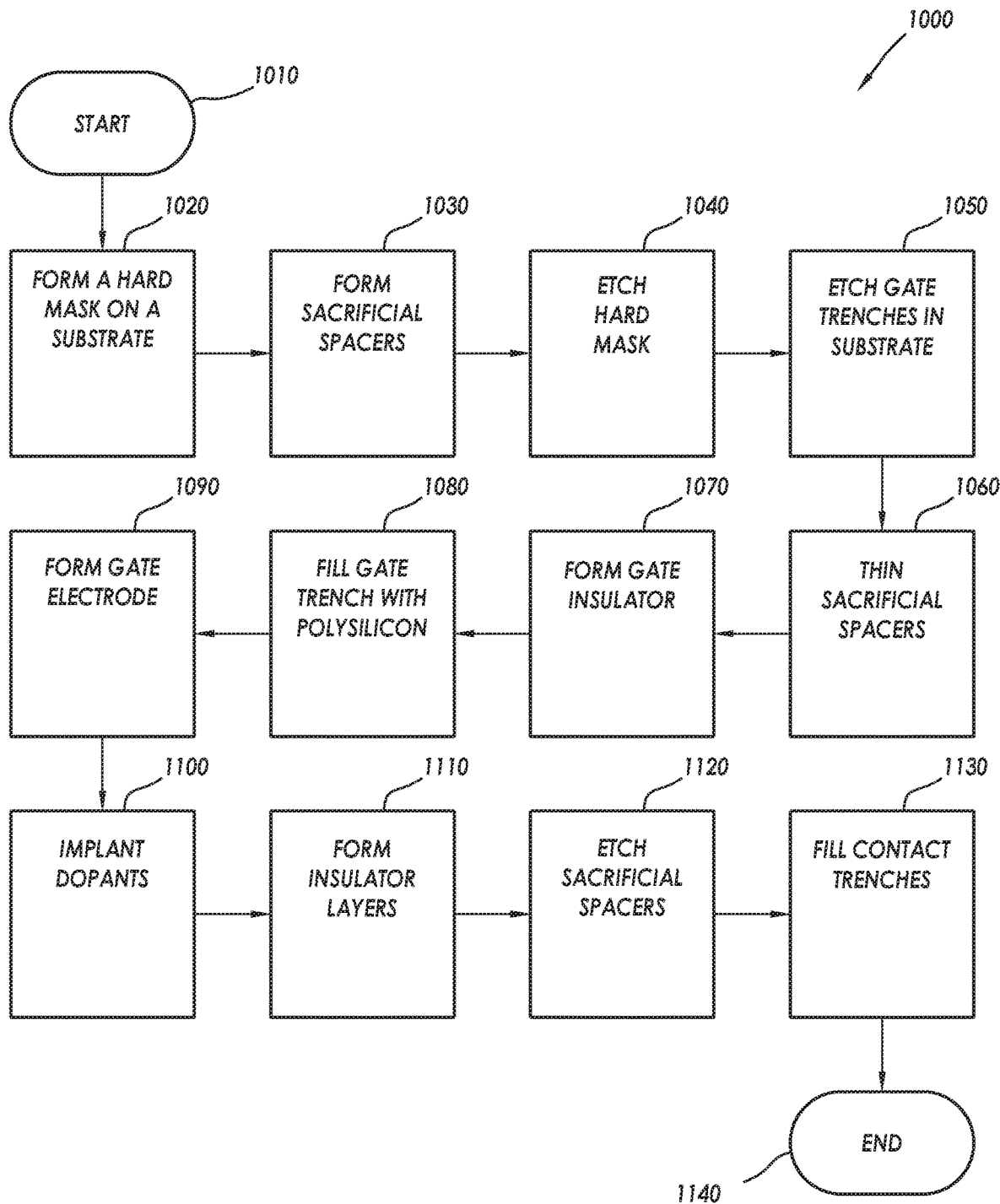
FIG. 1 is a flowchart of a fabrication process for an embodiment of a semiconductor device.

FIG. 1 is a flowchart of a fabrication process 1000 for an embodiment of a semiconductor device 100.

Figure 2:
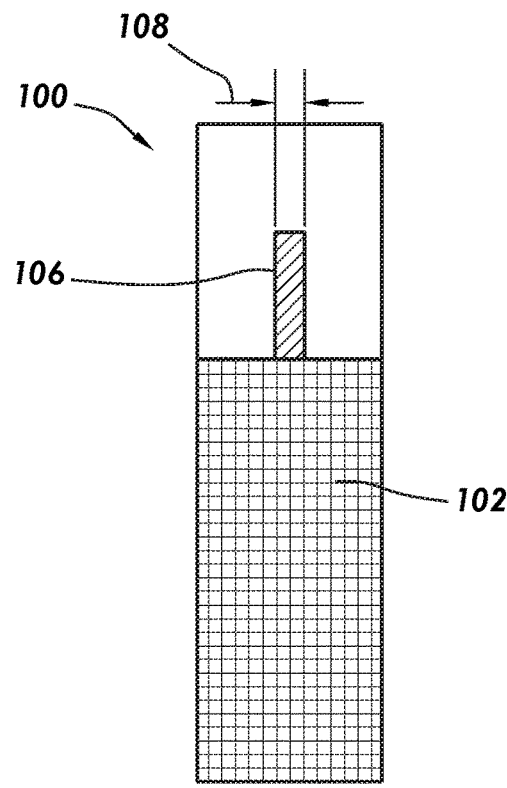
FIGS. 2-5 are cross-sectional side views of an embodiment of a semiconductor device during the fabrication process.

FIG. 2 is a cross-sectional side view of an embodiment of the semiconductor device 100 during the fabrication process. The semiconductor device 100 is fabricated on the substrate 102, which may include a variety of materials such as silicon, germanium, gallium arsenide, among others.

In the illustrated embodiment of the process 1000, at stage 1020, the semiconductor device 100 includes a hard mask pillar 106 that has been formed on the substrate 102. The hard mask pillar 106 may be formed through several processes such as depositing or growing a uniform layer of hard mask material on the substrate 102 followed by patterning the layer, and then etching the pattern so that only certain areas of the hard mask (e.g., the hard mask pillar 106) remain on the substrate 102. The lithographic pattern may also be applied before the hard mask material is deposited or grown on the substrate 102, such that the hard mask material is deposited in certain areas of the pattern while other areas (i.e., areas covered by the lithographic photoresist) do not receive the hard mask material in the first place. The lithography for etching the hard mask/hard mask pillar 106 may include KrF scanner lithography processing, ArF scanner lithography processing, or others.

Following the lithographic processes, the hard mask pillar 106 may be thinned beyond the pattern through a controlled etch process, such as a chemical wash, to leave the thinned hard mask pillar 106 with a specific desired thickness 108. Thinning the hard mask pillar 106 enables the hard mask pillar 106 to have a thickness 108 that is smaller than a minimum lithography limit of the lithography processing capability. The minimum lithography limit depends on the wavelength of the light that is used to illuminate the mask onto the photoresist on the semiconductor device 100. For example, KrF scanner lithography processing has a wavelength that has a minimum lithography limit of 300 nm of device pitch. ArF scanner lithography processing has a wavelength that has a minimum lithography limit of about 200 nm of device pitch. As explained below, this can also translate into other components of the semiconductor device 100 being smaller than the minimum lithography limit of the lithography processing capability. The hard mask pillar 106 in FIG. 2 may be one of many hard mask pillars 106 present on the substrate 102 to form a semiconductor circuit.

Figure 3:
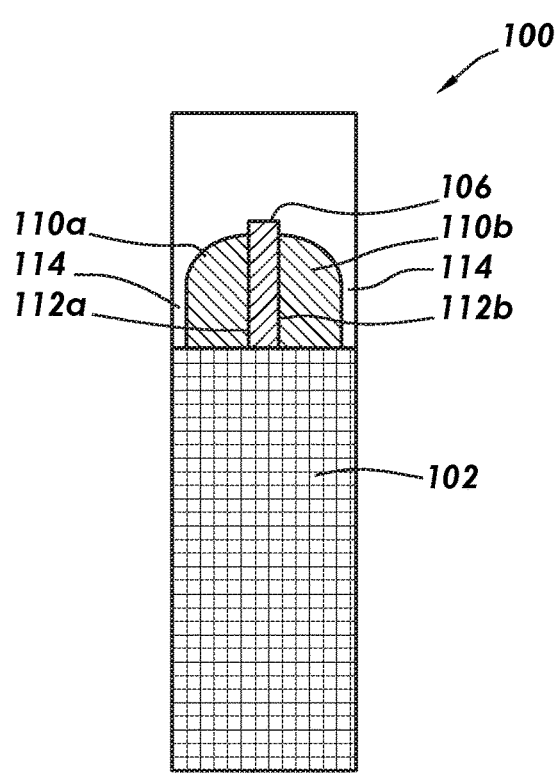

FIG. 3 is a cross-sectional side view of the embodiment of the semiconductor device 100 during the fabrication process 1000. As illustrated at stage 1030, the semiconductor device 100 includes sacrificial spacers 110a, 110b formed around the hard mask pillar 106. The substrate 102 may be cleaned before application of the sacrificial spacers 110a, 110b so that there is no oxide between the substrate 102 and the sacrificial spacers 110a, 110b. The cleaning ensures that the sacrificial spacers 110a, 110b remain attached to the substrate 102 if oxide-etching chemicals are used any time during the process 1000. The sacrificial spacers 110a, 110b may be formed using a variety of techniques. For example, a nitride layer may be uniformly deposited as a film over the entire surface of the substrate 102. The nitride layer may then subsequently be etched down to form the sacrificial spacers 110a and 110b.

Thus, when the nitride layer is etched, the semiconductor device 100 includes a first sacrificial spacer 110a on a first side 112a of the hard mask 106, a second sacrificial spacer 110b on a second side 112b of the hard mask 106, and open gaps 114 outside of the sacrificial spacers 110a, 110b. The first sacrificial spacer 110a may be the same size, or a different size from the second sacrificial spacer 110b. The pattern of gap 114, first sacrificial spacer 110a, hard mask pillar 106, second sacrificial spacer 110b, and gap 114 may be repeated, as necessary, to cover the substrate 102, or the area of the substrate 102 designed for a particular use (e.g., power current).

Figure 4:
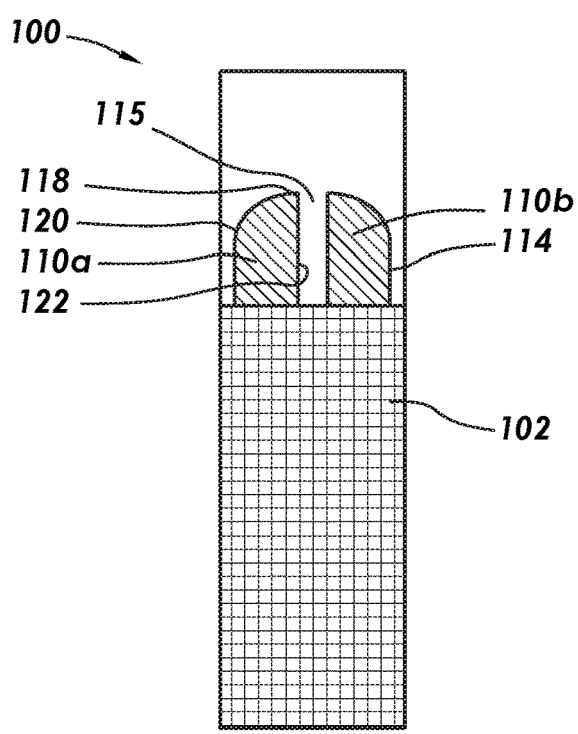

FIG. 4 illustrates, at stage 1040, the hard mask pillar 106 has been etched away to form an additional gap 115. The etching process is configured to remove the hard mask pillar 106 without interacting with the sacrificial spacers 110a, 110b or the substrate 102. This is one reason why the substrate 102 may be cleaned before depositing the sacrificial spacers 110a, 110b since the substrate 102 may have native oxide that is etched by the same treatment as the hard mask pillar 106.

In the illustrated embodiment, the first sacrificial spacer 110a includes a point 118 located between a slant side 120 and a point side 122. The point side 122 and the slant side 120 may be angled differently relative to the substrate 102 and/or curved differently. The gaps 114, 115 on either side of the first sacrificial spacer 110a, therefore, may also be different shapes. In certain embodiments (see FIG. 18 below), the sacrificial spacers 110a, 110b may be polished to remove the point 118 so that the sacrificial spacers 110a, 110b are squared off to increase the likelihood that each gap 114, 115 uniformly receives a wet etch process to form the trenches described below.

Figure 5:
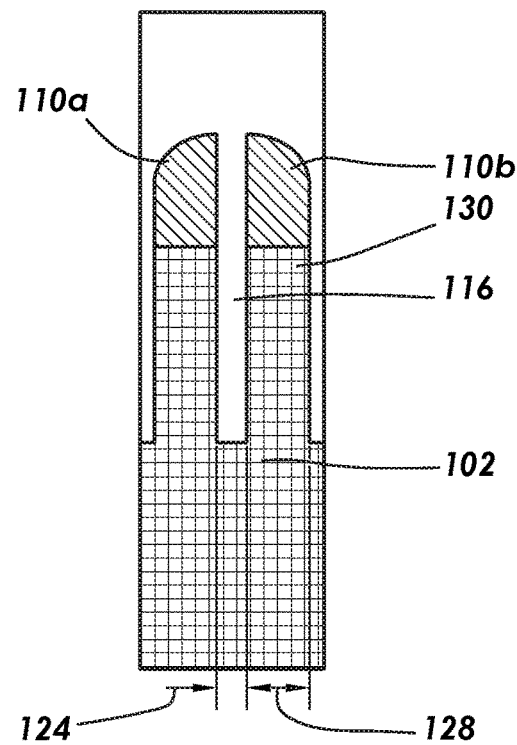

FIG. 5 is a cross-sectional side view of the embodiment of the semiconductor device 100 during a stage 1050 of the fabrication process 1000. The substrate 102 is etched in each gap 114, 115 to form gate trenches 116. The gate trenches 116 may be etched without significant change to the shape or size of the sacrificial spacers 110a, 110b. For example, the gate trenches 116 may be etched using a wet or dry etching process that etches the material of the substrate 102 without chemically interacting with the nitride of the sacrificial spacers 110a, 110b. The shape of the sacrificial spacers 110a, 110b (e.g., changed through polishing or etching) may also be used to adjust the shape of the gate trenches 116. For example, the gate trenches 116 may be deeper on a slant side 120 of the first sacrificial spacer 110a when the sacrificial spacer 110a has not been polished, since additional etching material may access the substrate 102 due to the broader gap 114. In FIG. 5 the sides of the gate trench 116 are illustrated as perpendicular with a constant width 124, but other shapes and/or angles of the gate trenches 116 may be etched into the substrate 102 as well. The width 124 may be the same size as the width 108 of the hard mask pillar 106 and may be, for example, less than 100 nm. Between the gate trenches 116 there is a Si mesa 130 with a width 128. As an example, the Si mesa width 128 may be between 60 nm and 200 nm. As highlighted above, this width 128 may be less than the lithographic limit that would otherwise be achievable for the semiconductor device 100. In some embodiments, the width 128 may be half of the lithographic limit since the sacrificial spacers 110a, 110b are not primarily formed through lithographic processes. As explained in detail below, the Si mesa 130 may be implanted with dopants to form channel, source, and body regions.

Figure 6:
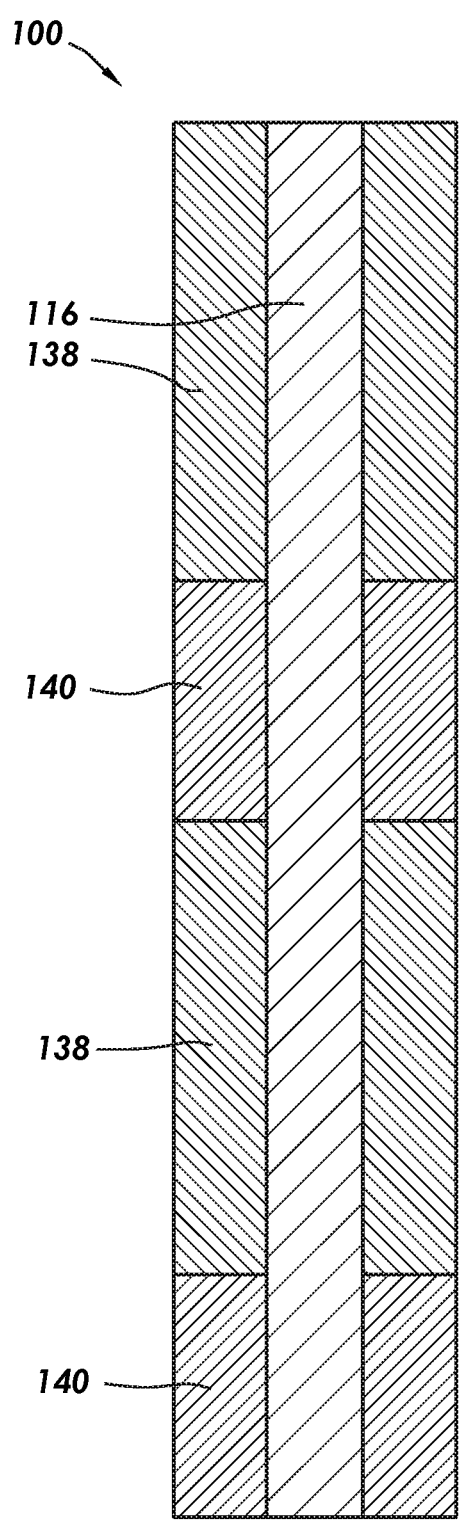
FIG. 6 is a cross-sectional top view of the embodiment of the semiconductor device.

FIG. 6 is a cross-sectional top view of the embodiment of the semiconductor device 100 at stage 1050. The top view shows that the gate trench 116 extends along the substrate 102. As described above with respect to the hard mask pillars 106, the gate trenches 116 may be formed as a plurality of parallel gate trenches 116 over the surface of the substrate 102. The semiconductor device 100 includes body regions 138 and source regions 140 that are designed to receive different types of doping. The body region 138 supplies the source region 130 and channel (see FIG. 11) with the positive charges or negative charges needed to turn on the semiconductor device 100 during operation. As the Si mesa width 128 narrows in designs of the semiconductor device 100, a higher ratio of the width occupied by the body region 138 and the source region 140 may be required to avoid parasitic bipolar transistor action. This condition may be exasperated if source contacts are not aligned along the Si mesa 130. The contacts disclosed here are self-aligned to the gate trenches 116 along the body region 138 and source regions 140 to avoid the parasitic bipolar transistor action.

Figure 7:
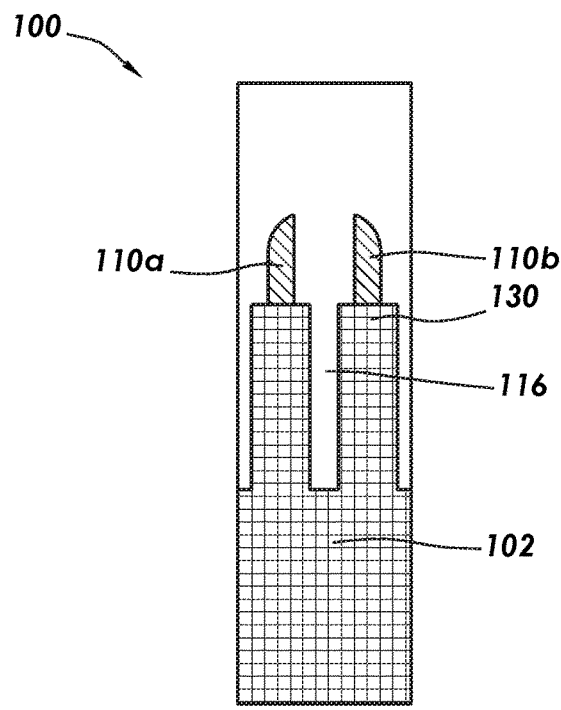
FIGS. 7-14 are cross-sectional side views of the embodiment of the semiconductor device during the fabrication process.

FIG. 7 is a cross-sectional side view of the embodiment of the semiconductor device 100 during a stage 1060 of the fabrication process 1000. The sacrificial spacers 110a, 110b have been thinned or decreased in cross-sectional area. The pull back is accomplished through etching processes that etch the sacrificial spacers 110a, 110b while having minimal effect on the Si mesa 130. As illustrated, the result of the pullback is that the Si mesa 130 is wider than the sacrificial spacers 110a, 110b.

Figure 8:
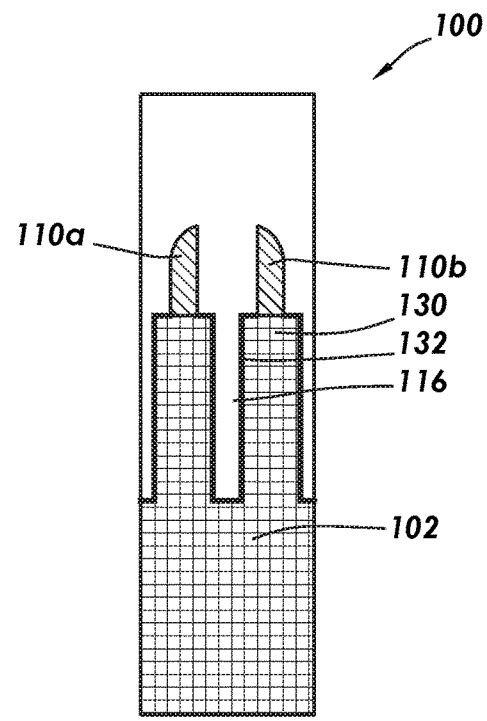

FIG. 8 is a cross-sectional side view of the embodiment of the semiconductor device 100 during a stage 1070 of the fabrication process 1000. The semiconductor device 100 has formed a layer of gate insulator or gate oxide 132 within the gate trenches 116 and on exposed areas of the Si mesa 130. The gate oxide 132 may be formed, for example, by growing silicon dioxide on the substrate 102.

Figure 9:
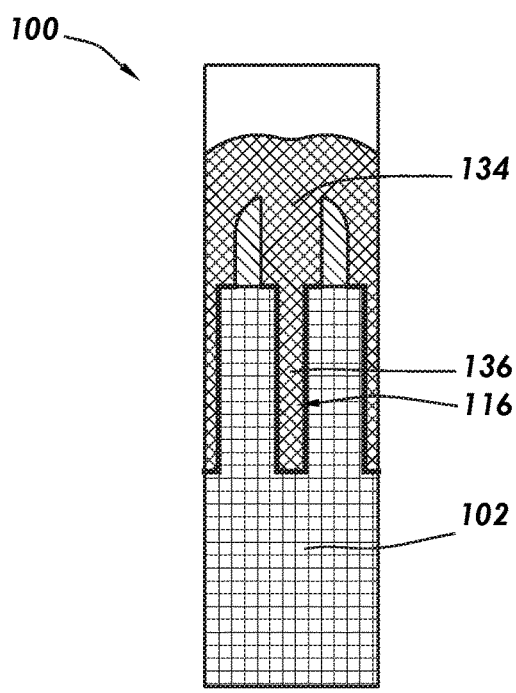

FIG. 9 is a cross-sectional side view of the embodiment of the semiconductor device 100 during at stage 1080 of the fabrication process 1000. The gate trenches 116 are filled with polysilicon 134 to form a gate electrode 136. The polysilicon 134 may be layered over the sacrificial spacers 110a, 110b and annealed.

Figure 10:
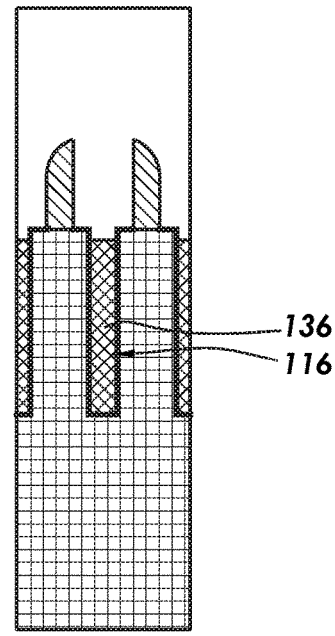

FIG. 10 is a cross-sectional side view of the embodiment of the semiconductor device 100 during a stage 1090 of the fabrication process 1000. The polysilicon 134 has been diminished so that only the gate electrode 136 remains within the gate trenches 116. Wet or dry etching processes may be used to etch the polysilicon 134 without affecting the sacrificial spacers 110, gate oxide 132, or the silicon mesa 130.

Figure 11:
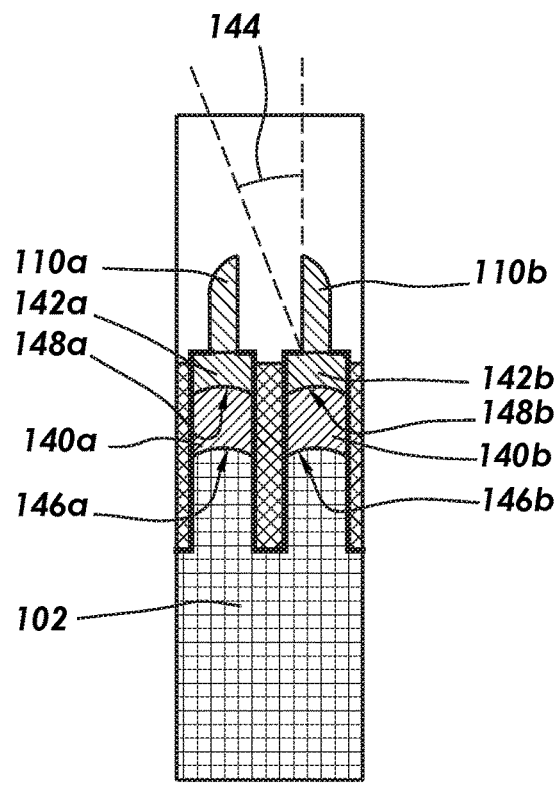

FIG. 11 is a cross-sectional side view of the embodiment of the semiconductor device 100 during a stage 1100 of the fabrication process 1000. The Si mesa 130 is implanted with one or more dopants to form channels 140a, 140b and sources 142a, 142b in the substrate 102. The dopants for the channel 140a, 140b may include, for example, Boron, Boron ions, or other similar dopants that provide positively charged holes, while the dopants for the source 142a, 142b may include, for example, Arsenic, Arsenic ions, or other similar dopants that provide negatively charged electrons to the semiconductor device 100. The first sacrificial spacer 110a has a first channel 140a and a first source 142a implanted beneath, and the second sacrificial spacer 110b has a second channel 140b and a second source 142b implanted beneath. It is possible for the dopant to be implanted straight into the Si mesa 130, but the dopants entering the Si mesa 130 directly below the sacrificial spacers 110a would have to pass through the sacrificial spacers 110a. The implanting energy would thus be different for different areas of the Si mesa 130, which complicates the fabrication process. Thus, the channels 140a, 140b and sources 142a, 142b may be implanted at an angle 144 to avoid the sacrificial spacers 110a, 110b during implantation. The angle 144 of implanting the dopant may result in a curved dopant profile such as 146a, 146b, 148a, 148b that form at the bottom of the channel 140a, 140b and source 142a, 142b, respectively. The angle 144 may be between 3 and 10 degrees, such as 7 degrees to implant the dopant into the Si mesa 130 and avoid the sacrificial spacer 110a, 110b.

Figure 12:
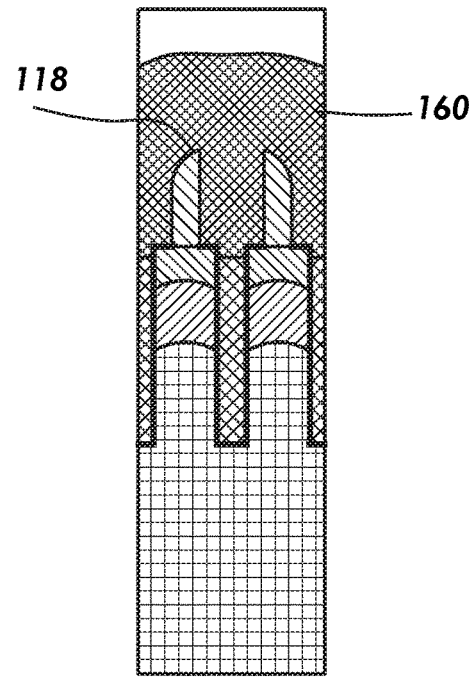

FIG. 12 is a cross-sectional side view of the embodiment of the semiconductor device 100 during a stage 1110 of the fabrication process 1000. The semiconductor device 100 includes an insulator layer 160 formed on top of the substrate 102 and around the sacrificial spacers 110a, 110b. The insulator layer 160 may include a variety of materials for insulating the substrate 102 from a future source plate or other conducting components that may be present above the insulator 160. For example, the insulator may include oxide, glass, or other materials. Furthermore, the insulator 160 may be annealed, but in some examples the insulator 160 is not annealed.

Figure 13:
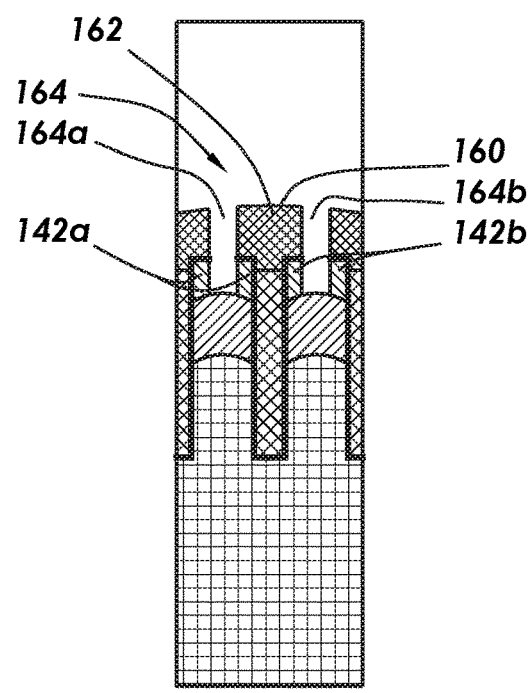

FIG. 13 is a cross-sectional side view of the embodiment of the semiconductor device 100 during a stage 1120 of the fabrication process 1000. The insulator layer 160 has been etched so that a top surface 162 falls at least below the point 118 of the sacrificial spacers 110a, 110b. This enables an etch process to remove the sacrificial spacers 110a, 110b from within the insulator layer 160 to form contact trenches 164a, 164b. The contact trenches 164a, 164b etched through the top surface 162 into the insulator layer 160 and into the source regions 142a, 142b. Additionally, as illustrated the contact trenches 164a, 164b may be etched through the source regions 142a, 142b such that the contact trenches protrude to the channel 140a, 140b. In certain other examples, the contact trenches 164a, 164b may be etched to different depths within the substrate 102. For instance, the semiconductor device 100 may be formed so that the first contact trench extends through the first source 142a while a second contact trench 164b is etched to just contact the second source 142b without punching through, or vice versa.

Figure 14:
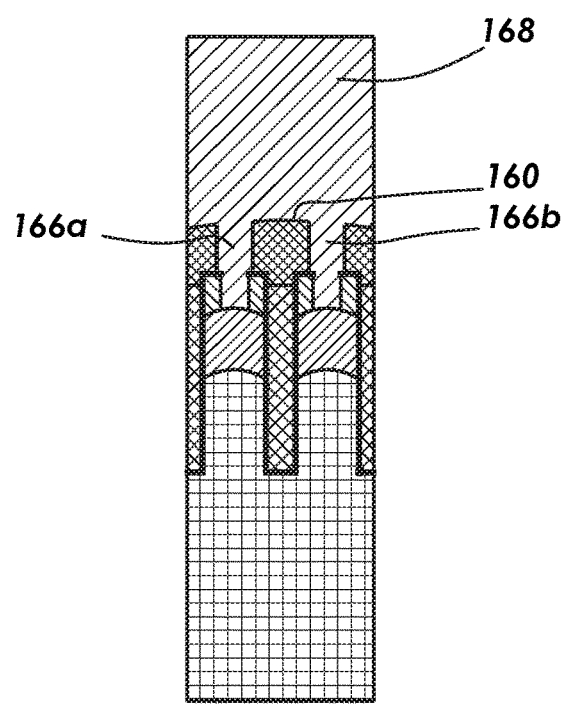

FIG. 14 is a cross-sectional side view of the embodiment of the semiconductor device 100 during a stage 1130 of the fabrication process 1000. The contact trenches 164a, 164b have been filled with metal or other conductive material to form contacts 166a, 166b. The contacts 166a, 166b may electrically connect and include the same conductive material as a source plate 168 that electrically connects the semiconductor device 100 to a different device or to a power source.

Figure 15:
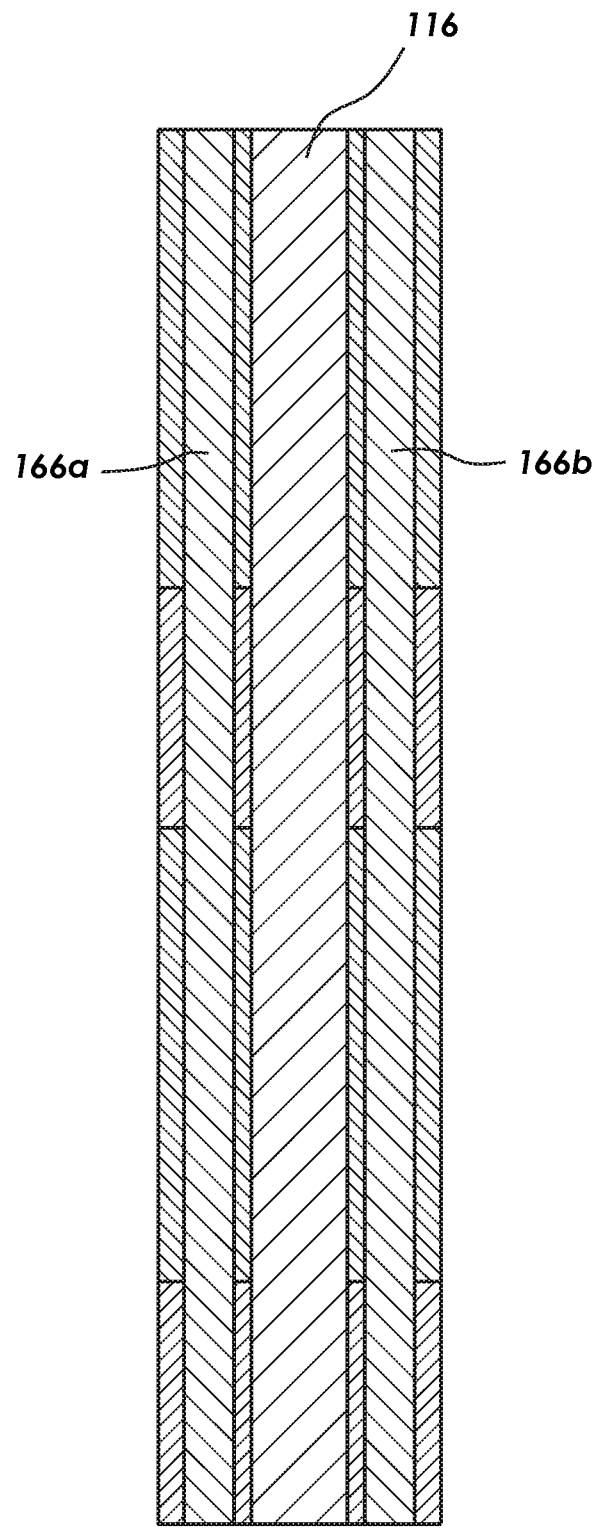
FIG. 15 is a cross-sectional top view of the embodiment of the embodiment of the semiconductor device.

The process 1000 ends at a stage 1140 with the contacts 166a, 166b formed and aligned to the Si mesa 130. Further treatments may be conducted on the semiconductor device 100 before it is a finished product. As shown in the cross-sectional top view of FIG. 15, at stage 1140 the contacts 166a, 166b are self-aligned with the gate trench 116 independent of the lithographic process that was used during any previous processes. Charging the gate electrode 136 thus enables a current to flow through the substrate 102 and the source plate 168 through a narrow Si mesa 130 while still using normal lithography scanners.

Figure 16:
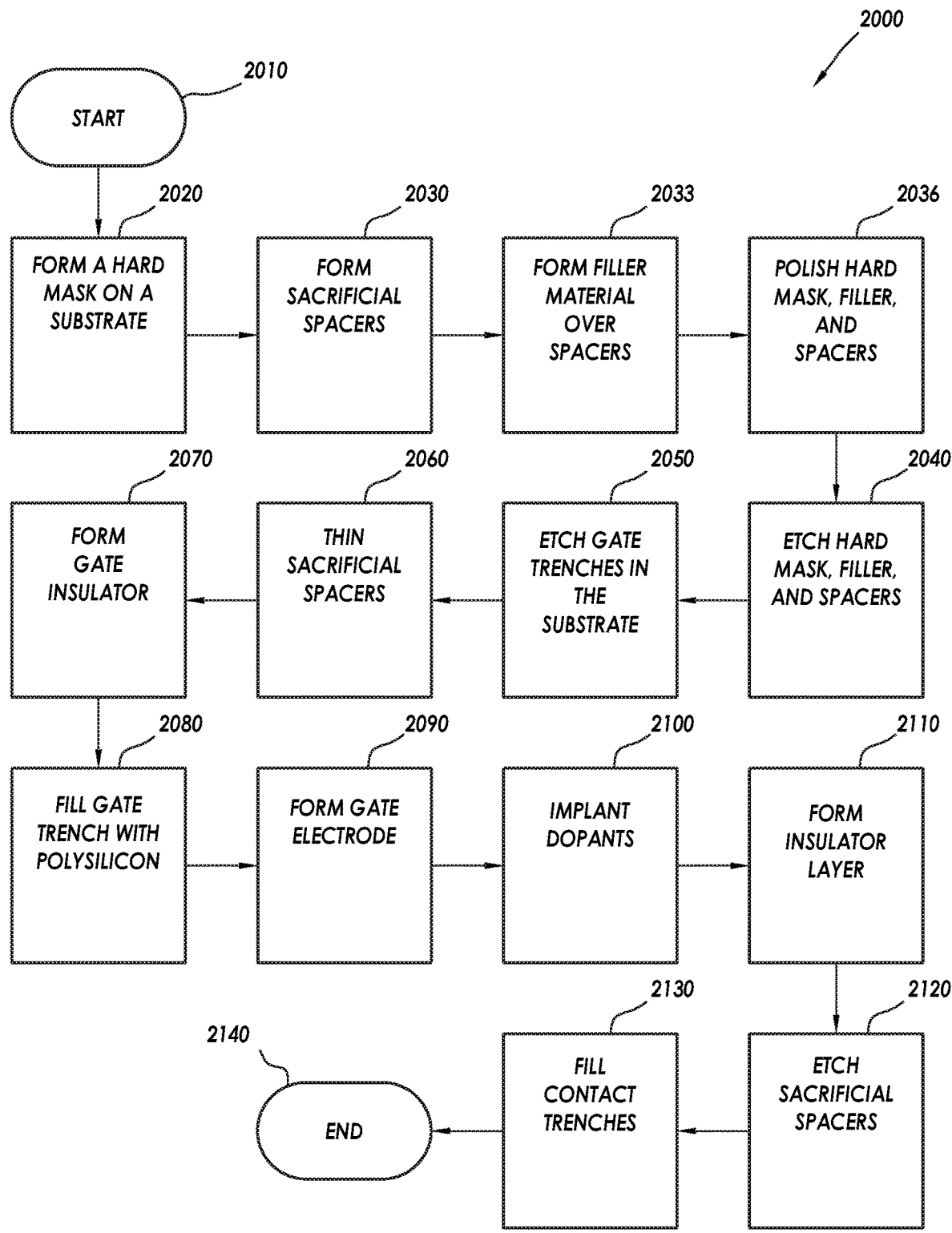
FIG. 16 is a flowchart of a possible fabrication process for a second embodiment of a semiconductor device.

FIG. 16 is a flowchart of a possible fabrication process 2000 for a second embodiment of a semiconductor device 200. The semiconductor device 200 may be fabricated in the order indicated in the flowchart, but this is not necessarily required. Furthermore, as with the semiconductor device 100 described above, the semiconductor device 200 may be fabricated as part of a larger circuit, and the process 2000 may start at a stage 2010 after completion of additional or alternative treatments. The process 2000 may include several process features that are not illustrated, but have been described above. For example, at a stage 2020, the semiconductor device 200 may have a hard mask pillar 208 formed thereon, and at a stage 2030, sacrificial spacers 210a, 210b, 210c, 210d formed as well. In the process 2000, the semiconductor device 200 may include additional or alternative treatments as described below.

Figure 17:
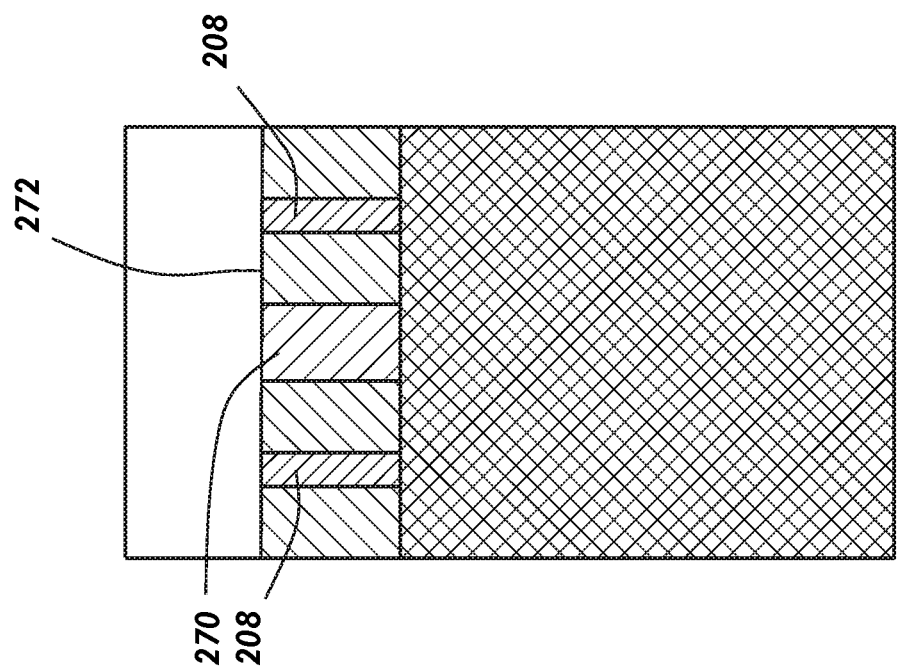
FIGS. 17-20 are cross-sectional side views of a second embodiment of a semiconductor device during the fabrication process.

FIG. 17 is a cross-sectional side view of a second embodiment of the semiconductor device 200 during a stage 2033 of the fabrication process 2000. FIG. 17 illustrates the additional or alternative treatment before the hard mask pillar 208 is etched as described above at stage 1040 and FIG. 4. That is, once the hard mask pillar 208 and sacrificial spacers 210a, 210b, 210c, 210d have been formed on a substrate 202, a filler material 270, such as glass or doped glass, is formed over the sacrificial spacers 210 and the hard mask pillar 208. The filler material 270 fills a gap 214 between the sacrificial spacers 210a, 210b, 210c, 210d that is not occupied by the hard mask pillar 208.

Figure 18:
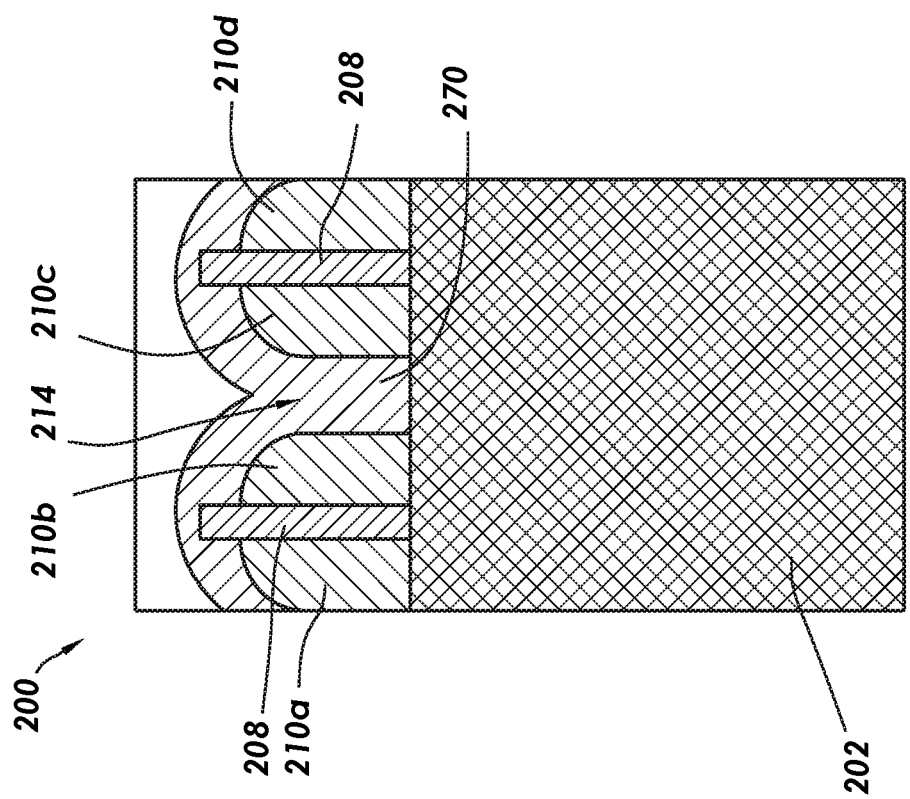

FIG. 18 is a cross-sectional side view of the second embodiment of the semiconductor device 200 during a stage 2036 of the fabrication process 2000. The filler material 270, the sacrificial spacers 210a, 210b, 210c, 210d, and the hard mask pillar 208 are polished so that a top surface 272 is level with the substrate 202. This polishing makes the top surface 272 of the sacrificial spacers 210a, 210b, 210c, 210d flat, such that both sides of the sacrificial spacer are even.

Figure 20:
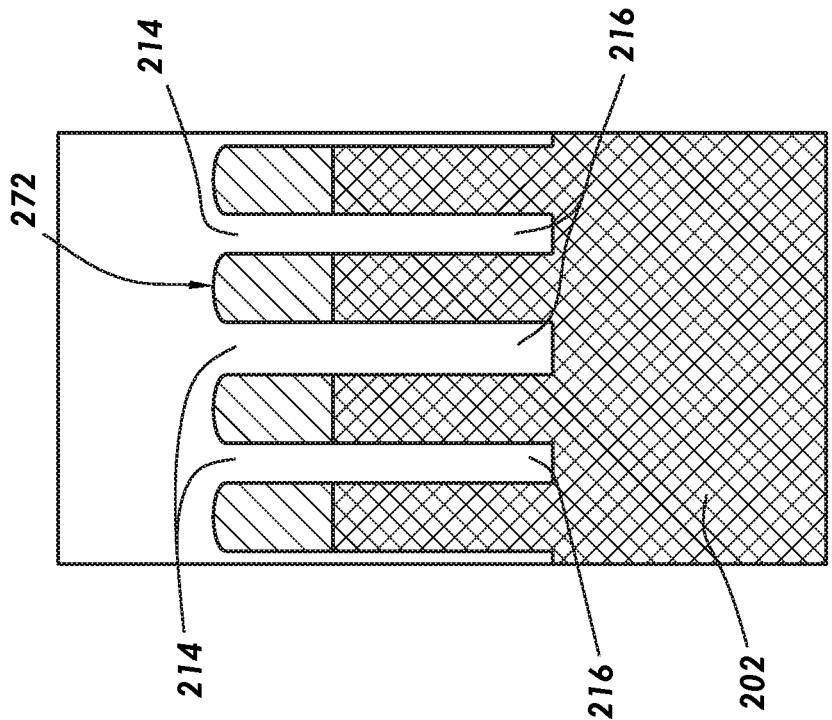
Figure 19:
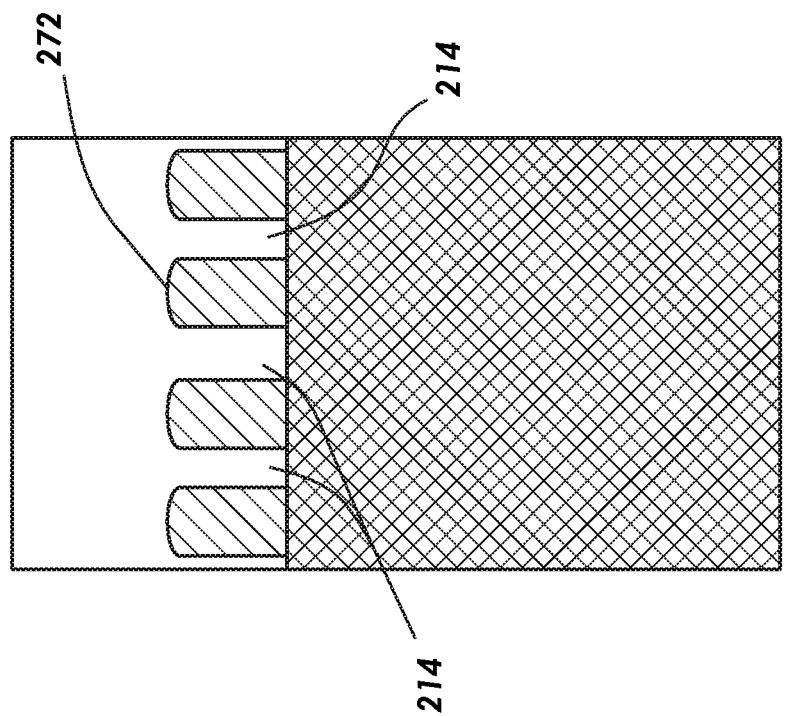

FIG. 19 is a cross-sectional side view of the second embodiment of a semiconductor device during a stage 2040 of the fabrication process 2000. As illustrated above at FIG. 3, the hard mask 208 may be removed and/or etched with minimal effect on the sacrificial spacers 210. Furthermore, the filler material 270 may also be removed and/or etched with minimal effect on the sacrificial spacers 210a, 210b, 210c, 210d. After etching of the hard mask pillars 208 and the filler material 270, the semiconductor device 200 has gaps 214 on each side of the sacrificial spacers 210. The gaps 214 may therefore be used to etch gate trenches 216, as shown in the cross-sectional side view of FIG. 20. Thus, including the additional or alternative treatment of layering the filler material 270 may be beneficial in creating a top surface 272 that is flat, which can result in better uniformity in the depth and width of the gate trenches 216. The process 2000 may include the other treatments mentioned above with respect to FIG. 1 to form channels, sources, and source contacts within the semiconductor device 200. The process 2000 ends 2140 after the source contacts are filled with a conductive material, and the semiconductor 200 is ready to further treatment.

The invention claimed is:

1. A semiconductor device, comprising:
   a silicon substrate comprising a surface;
   a gate electrode formed in a gate trench extending into the substrate from the surface;
   a channel region adjacent to the gate electrode comprising a non-uniform channel dopant profile;
   a source region adjacent to the gate electrode between the surface and the channel region, comprising a non-uniform source dopant profile;
   an insulator layer formed above the substrate; and
   a source contact extending through the insulator layer, wherein the source contact comprises a width that is less than a minimum lithography limit for a processing capability.

2. The semiconductor device of claim 1, wherein the channel dopant profile comprises a curved profile, wherein a dopant concentration directly below the source contact is lower than a dopant concentration further from the source contact.

3. The semiconductor device of claim 1, wherein the source dopant profile comprises a curved profile, wherein a dopant concentration directly below the source contact is lower than a dopant concentration further from the source contact.

4. The semiconductor device of claim 1, wherein the source contact is self-aligned with the gate electrode.

5. The semiconductor device of claim 1, comprising a Si mesa width less than 200 nm.

6. The semiconductor device of claim 1, comprising a gate trench width of less than 100 nm.

7. The semiconductor device of claim 1, wherein the source contact extends through the source region and contacts the channel region.

8. The semiconductor device of claim 1, comprising a ratio of the width of the body region to a width of the source region that is greater than two.

9. The semiconductor device of claim 1, comprising an additional gate electrode formed in an additional gate trench located opposite the channel from the gate trench.

* * * * *